United States Patent [19]

Leigh

[11] Patent Number: 5,007,022

[45] Date of Patent: Apr. 9, 1991

[54] TWO-PORT TWO-TRANSISTOR DRAM

[75] Inventor: Anthony W. Leigh, Houston, Tex.

[73] Assignee: Texas Instruments Incorporated, Dallas, Tex.

[21] Appl. No.: 434,617

[22] Filed: Nov. 9, 1989

Related U.S. Application Data

[63] Continuation of Ser. No. 135,957, Dec. 21, 1987, abandoned.

[51] Int. Cl.⁵ .................. G11C 11/40; G11C 13/00
[52] U.S. Cl. ............... 365/189.04; 365/149; 365/222; 365/230.05
[58] Field of Search .............. 365/149, 189.01, 189.04, 365/222, 230.05

[56] References Cited

U.S. PATENT DOCUMENTS

| | | | |
|---|---|---|---|
| 4,447,891 | 5/1984 | Kadota | 364/154 |
| 4,506,322 | 3/1985 | Leigh | 364/209 |
| 4,546,273 | 10/1985 | Osman | 365/222 |
| 4,677,592 | 6/1987 | Sakurai et al. | 365/222 |
| 4,679,172 | 7/1987 | Kirsch et al. | 365/222 |
| 4,716,548 | 12/1987 | Mochizuki | 365/149 |
| 4,739,502 | 4/1988 | Nozaki | 365/233 |
| 4,740,926 | 4/1988 | Takemae et al. | 365/203 |
| 4,760,559 | 7/1988 | Hidaka et al. | 365/189 |
| 4,780,849 | 10/1988 | Nakagawa et al. | 365/189 |
| 4,794,571 | 12/1988 | Uchida | 365/205 |

*Primary Examiner*—Terrell W. Fears
*Attorney, Agent, or Firm*—Ronald O. Neerings; Thomas W. Demond; Melvin Sharp

[57] ABSTRACT

A DRAM array having a number of two-port cells (10) arranged to permit the simultaneous read and write operations of different cells within the array. Each column of the array includes a refresh circuit (40) which is responsive to a four-phase clock for carrying out refresh operations which are transparent to the programmer. When used in microcomputer applications having four-phase clocks, the DRAM array of the invention functions similar to a static RAM, in that refresh is automatically undertaken.

35 Claims, 3 Drawing Sheets

TWO-PORT TWO-TRANSISTOR DRAM

This application is a continuation of application Ser. No. 07/135,957, filed Dec. 21, 1987, now abandoned.

TECHNICAL FIELD OF THE INVENTION

The present invention relates in general to semiconductor memories, and more particularly to multi-port memories of the DRAM type.

BACKGROUND OF THE INVENTION

On-chip random access memories (RAM) have become an essential part of high speed microcomputers. Nonvolatile static type of RAMs are a favored choice of memories for use with microcomputers, as such memories require neither refresh cycles nor corresponding refresh circuitry. U.S. Pat. No. 4,506,322, by Leigh, illustrates a six-transistor memory adapted for use with a high speed microcomputer. However, standard six-transistor or even four-transistor static memories require a substantial amount of wafer area, thereby limiting microcomputer chip designs with respect to on-chip memory capacity.

The dynamic type of random access memories can have as few as one integrated transistor and one capacitor component, and thus a large number of such cells can be fabricated in a small wafer area. However, the dynamic type of random access memories is volatile, in that the stored charge on the capacitor is required to be periodically refreshed, thereby requiring, in many instances, refresh circuitry. On the other hand, the memory refresh requirements may be left to the programmer of the microcomputer to assure that all cells have been accessed in a prescribed period of time.

In high-speed microcomputer applications which are computational intensive, such as in digital signal processing, a large amount of on-chip memory is required. "Cycle stealing" techniques commonly employed by programmers for memory refresh purposes are thus limited. Also, dynamic RAM memories are not easily integrated with microcomputers requiring read and write operations of different addresses within a single machine cycle. Typically, a four-phase microcomputer clocking system provides no time slot for refreshing the memory, and thus the burden is placed on the programmer to ensure that the entire memory array is refreshed. As noted, in real time applications, this constraint is highly undesirable.

U.S. Pat. No. 4,447,891 by Kadota discloses a RAM array which permits simultaneous read and write operations of the various cells of the array, independently of each other. The memory cells of the noted patent each comprise a cross-coupled inverter with additional transistors to effect read and write access to the cell. Complementary data lines are also required by the cell. Although the memory array of the noted patent is of the static type which requires no refresh support considerations, each cell comprises a large number of transistors and thus is not well adapted for high density applications.

From the foregoing, it can be seen that a need exists for an improved memory array having dynamic-type cells adapted for high density fabrication, and in which refresh operations are transparent to the programmer or user. A further need exists for a semiconductor memory which is well adapted for use with a four-phase machine cycle where read and write operations of different cells can occur during the same cycle, and where memory refresh operations are automatically undertaken. Yet a further need exists for a memory array having cells with two transistors and a capacitor component, all well adapted for fabrication according to current semiconductor processing techniques.

SUMMARY OF THE INVENTION

In accordance with the present invention, the disclosed dynamic random access memory array reduces or substantially eliminates the disadvantages and shortcomings associated with the prior art devices. According to the invention, there is disclosed a DRAM array, each cell of which is of the dynamic type, including a first transistor or access device in series with a storage node of a storage capacitor for storing charge thereon during read operations, and a second series transistor or access device for accessing the storage node of the capacitor during write operations. Moreover, each cell is provided with a write bit line utilized during write operations for transferring a charge through the write transistor to the storage node of the capacitor. In like manner, a read bit line is connected to the read transistor for transferring a charge from the storage node of the capacitor, via the read transistor, to sense amplifier circuits. The read sense amplifier associated with each column of the array also functions to restore cell data after read operations of the cell.

A refresh sense amplifier is also provided for each memory array column to refresh cell data during a particular phase of the four-phase clock.

The noted DRAM array of the invention thus includes a relatively small number of components per cell, thereby requiring very little semiconductor wafer area. In addition, each cell includes a port for read operations and a port for write operations such that simultaneous read and write operations of different cells of the array can be realized. Another important technical advantage of the invention is that provisions are made for the periodic and automatic refresh of the array cells, without intervention by the user or programmer of the memory.

BRIEF DESCRIPTION OF THE DRAWINGS

Further features and advantages will become apparent from the following and more particular description of the preferred embodiment of the invention, as illustrated in accompanying drawings in which like reference characters generally refer to the same parts, elements or functions throughout the views, and in which:

FIG. 5 is a representation of a semiconductor chip carrying a microcomputer and the memory cell of the invention.

DETAILED DESCRIPTION OF THE INVENTION

Figure 1:
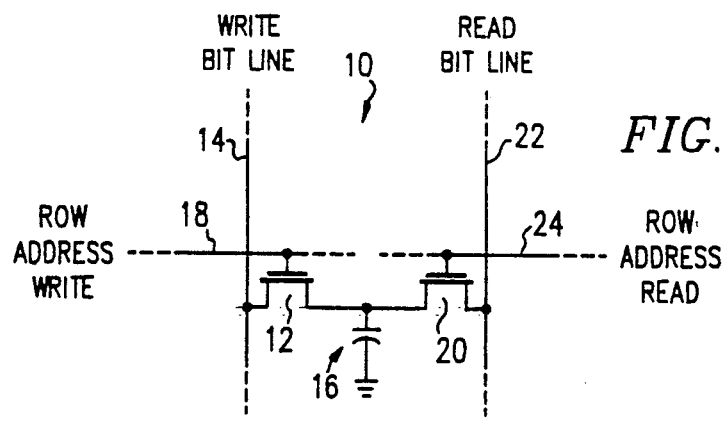
FIG. 1 is an electrical schematic diagram of an exemplary memory cell of the invention.

With reference to FIG. 1, there is illustrated an exemplary cell constructed in accordance with the invention. It is to be understood at the outset that in practice a DRAM array would include many similar cells arranged in rows and columns for accessing selected cells during read and write operations. In addition, a memory embodying a number of such cells would include conventional address decode circuits, clocking circuits, sense amplifier circuits, data and address buffers, and a number of other circuits (all not shown) which would be required to support memory operations. Also, the invention may be advantageously embodied as on-chip memory with a microcomputer, or integrated into a memory chip by itself.

The memory cell 10 of the invention includes a write field effect transistor 12 having a source and drain connected in series between a write bit line 14 and a storage node 15 of a storage capacitor 16, connected between node 15 and a reference voltage 17 of ground potential. The write transistor 12 also has a gate and is driven into conduction by signals carried by a row address write line 18 connected to its gate. The cell 10 also includes a read field effect transistor 20 having a source and drain connected in series between a read bit line 22 and the storage node 15 at capacitor 16. The read transistor 20 also has a gate and is driven into conduction by signals carried by a row address read line 24 connected to its gate.

In the preferred form of the invention, the write and read transistors 12 and 20 form access circuits and are N-channel MOS devices constructed to exhibit enhancement mode characteristics. Of course, those skilled in the art may prefer to construct a memory array utilizing a different type of transistor. Also, the storage capacitor 16 is preferably of the semiconductor type which exhibits a high capacitance per unit of wafer area. While the memory cell 10 of the invention can be constructed using conventional planar technology, the components of the cell can be embodied as well utilizing the more recently developed semiconductor trench technology.

The operation of the two-transistor DRAM cell 10 is described briefly as follows. In response to write operations of the cell 10, an address to the memory array is decoded such that a row address signal on the row address write line 18 is driven to a high logic level, wherein the write transistor 12 is driven into conduction. The row address read line 24 remains at a logic low level, thereby maintaining the read transistor 20 in a nonconducting state. Coincident with the write signal on the row address write line 18, a datum level signal is applied to the write bit line 14, the corresponding electrical charge of which is stored on the storage capacitor 16. With the write transistor 12 in a conduction state, the electrical charge on the write bit line 14 is transferred through the low impedance data path of the source and drain of write transistor 12 to the storage node 15 at capacitor 16.

In writing the DRAM cell 10 with information representative of a "0" or low datum level, no charge is applied to the write bit line 14, wherein the storage capacitor 16 does not become charged. On the other hand, when it is desired to write the DRAM cell 10 with a signal representative of a "1" or high datum level, a logic high signal is applied to the write bit line 14, whereupon a corresponding charge is transferred through the write transistor 12 for storage on the capacitor 16. After writing the cell to store a charge, the row signal on the row address write 18 line returns to a low state. The write transistor 12 thus ceases conducting, thereby trapping the charge on the storage capacitor.

Because of high resistance leakage paths normally associated with integrated semiconductor devices, the charge trapped on the storage node 15 of capacitor 16 slowly discharges, thus necessitating recharging or refreshing.

Memory read operations of the DRAM cell 10 are accomplished by decoding an address signal and applying a corresponding logic high row signal to the row address read line 24. As a result, the read transistor 20 is driven into conduction, thereby connecting the read bit line 22 to the storage node 15 at capacitor 16 through a low resistance data path. During the read operation, the corresponding row address write line 18 connected to the cell remains at a logic low state, thereby maintaining the write transistor 12 in a nonconducting state. The electrical charge, if any, stored on the capacitor 16 is transferred during read operations, via the read transistor source and drain 20, to the read bit line 22. The read bit line 22 may be precharged to a specified level during read operations to improve the sensitivity in detecting whether a datum high or low signal has been stored on the storage capacitor 16. For example, if no charge corresponding to a datum low has been stored on the storage capacitor 16, the read bit line 22 will become discharged by the storage node 15 of capacitor 16, thereby indicating a datum low level. Conversely, if substantial charge corresponding to a datum high level has been stored on the storage node 15 of capacitor 16, such charge will be transferred during read operations through the read transistor 20 to the read bit line 22, thereby charging it up to even a higher level. As a result, such a change in the precharged state of the read bit line 22 indicates that a datum high level has been previously stored on the storage node 15 of capacitor 16.

While not shown in FIG. 1, it is to be understood that a number of additional similar cells are connected between the write bit line 14 and the read bit line 22 to form a column of cells of the memory array. A number of other similar memory cells are connected to the row address write line 18 and the row address read line 24, thereby forming a row of cells in the memory array.

For each column of cells, the read bit line 22 is connected to a read sense amplifier to determine whether the charge transferred thereto from the storage capacitor 16 corresponds to a datum high or datum low level. In addition, and to be described in more detail below, each column of cells is provided with refresh and restore circuits for periodically refreshing each addressed cell of the column so that the charge stored on the capacitor 16 is maintained at a datum level that was previously written therein. Since the DRAM cells of the invention are of the type wherein the information stored on the storage capacitor 16 is destroyed after a read operation, the restore circuit rewrites the same information into the cell 10 to thereby preserve the datum in the memory.

In accordance with an important feature of the invention, the DRAM memory cell 10 is characterized as having a write port dedicated to write operations of the cell. The write port is formed or identified by the write bit line 14 and the row address write line 18. In like manner, the cell 10 includes a dedicated read port formed or identified by the read bit line 22 and the row address read line 24. Both ports function independently, in that one cell in an array column can be written with data on one bit line and row line pair, while another cell in that column can be read on another bit line and row line pair. Hence, the two-port nature of the memory array of the invention permits expedited memory operations, in that read and write operations can be completed during a single machine cycle. More generally, the DRAM array of the invention can undergo two accesses per machine cycle, which accesses can be any combination of read or write operations at different cell locations.

Figure 2:
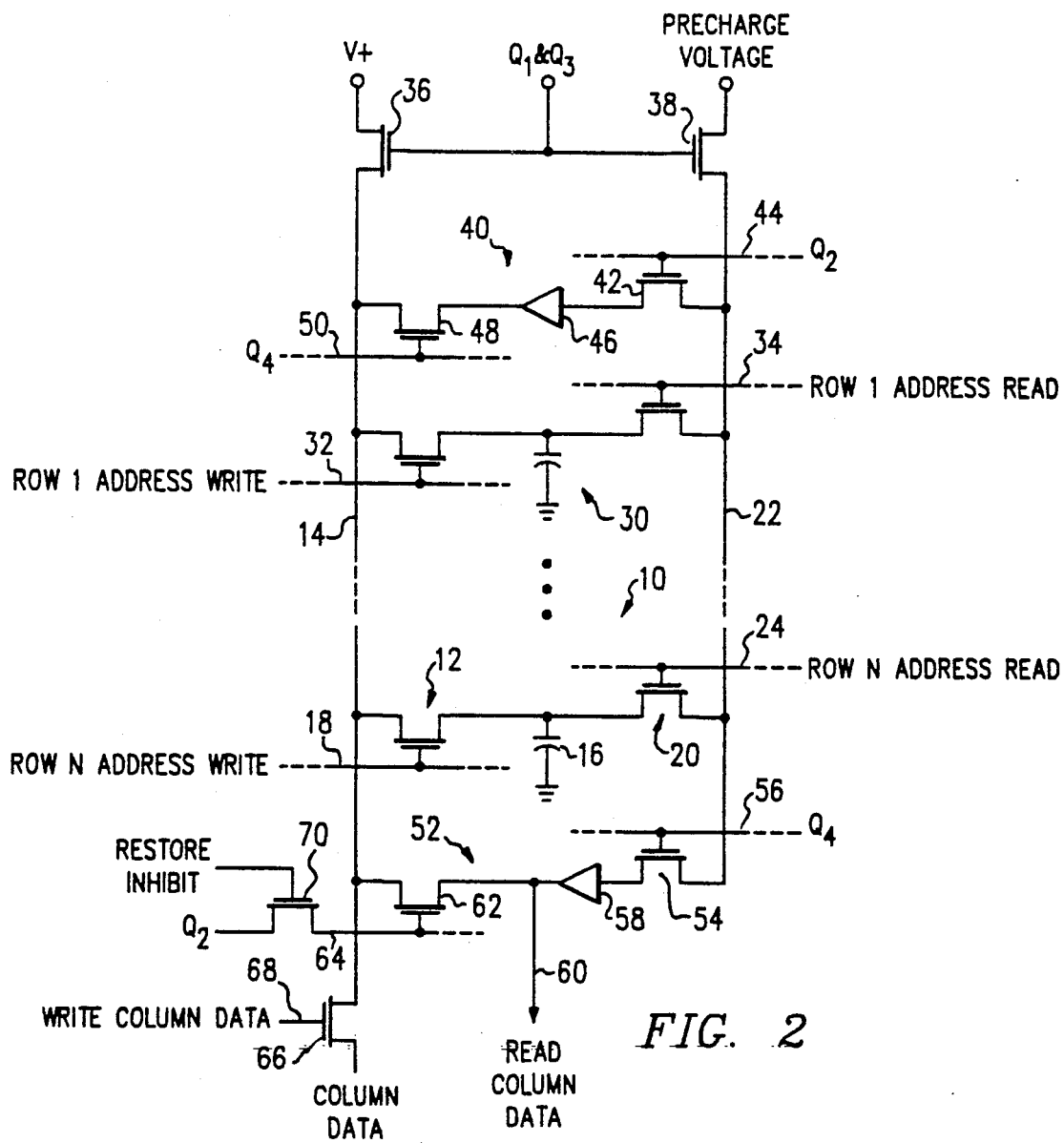
FIG. 2 is a portion of a memory array column embodying the principles and concepts of the invention.

With reference now to FIG. 2, there is shown an exemplary array column 25 having a number of cells constructed substantially identical to that shown in FIG. 1. Each array column may include a reasonable number of DRAM memory cells, two of which, 10 and 30, are shown in FIG. 2. DRAM cell 30 comprises a two-transistor cell connected to the same write bit line 14 and read bit line 22 as memory cell 10. In contrast, cell 30 employs a different row address write line 32 than that of cell 10. In like manner, cell 30 employs a different row address read line 34 than that cell 10. Each cell of the column is constructed similarly, having dedicated and different row address read and write lines than the other cells of the column. However, the respective rows (not shown) of DRAM cells of the exemplary array share the same respective row address read and row address write lines.

The memory array of the invention is constructed to operate optimally in a four-phase system, having phases identified as Q1-Q4. During each of clock phases Q1 and Q3, the write bit line 14 and read bit line 22 are precharged. The write bit line 14 is precharged by transistor 36 to a voltage $V + - Vt$, where Vt is the threshold voltage of transistor 36. The read bit line 22 is precharged during the noted clock phases to a predefined precharge voltage by transistor 38. The read bit line 22 is precharged to a voltage comprising one transistor threshold voltage below the precharge voltage supply. The precharge voltage is preferably about one-half that of the V. magnitude. In this manner, the readout detection of a "1" or "0" data level from a selected DRAM cell is simplified.

Connected between the write bit line 14 and the read bit line 22 is a refresh circuit 40 for refreshing the column cells during predefined phases of the system clock cycle. The refresh circuit 40 includes an input transistor 42 driven by a refresh line 44 which is operational during a Q2 phase. When the refresh line 44 is driven to a logic high state, the input transistor 42 is driven into conduction, thereby connecting the read bit line 22 to the input of a sense amplifier 46. The sense amplifier 46 is of conventional design, and of the type utilized in DRAM memories. Connected to the output of the sense amplifier 46 is an output transistor 48 which is driven by a second refresh line 50. The second refresh line 50 is driven during a clock phase Q4 for placing a refresh logic level on the write bit line 14. The refresh operation of the illustrated array column will be described in greater detail below. Other refresh circuits of other associated array columns are driven by the refresh lines 44 and 50.

The exemplary array column also includes a restore circuit 52 for restoring the contents of a cell after a read operation thereof. Due to the destructive nature of read operations of the DRAM memory cells of the invention, the contents of each cell must be restored after each read operation. The restore circuit 52 is similar in design to that of the refresh circuit 40. To that end, an input transistor 54 is driven during a Q4 clock phase by a clock signal on a restore line 56. Data then present on the read bit line 22 is transferred through the transistor 54 to the input of a read/restore sense amplifier 58. The output of the read/restore sense amplifier 58 produces a datum signal on output 60 which represents the datum high or low signal resulting from a cell read operation. In addition, the output of the read/restore sense amplifier 58 is coupled through an output transistor 62 to the write bit line 14. The output transistor 62 is driven by a Q2 clock phase on a second restore line 64. As noted, the first and second restore lines 56 and 64 are common to other columns of the array.

Having set forth the structure of a typical column of the memory array of the invention, the operation thereof will next be described in connection with FIG. 2, along with the waveforms of FIG. 3. The memory of the invention is readily adapted for use with a multiphase clock, as indicated by the four phases Q1-Q4 shown in FIGS. 3a-3d.

Figure 3A:
FIGS. 3a-3i are electrical waveforms illustrating the functional features of the invention.
Figure 3B:
Figure 3C:
Figure 3D:
Figure 3E:
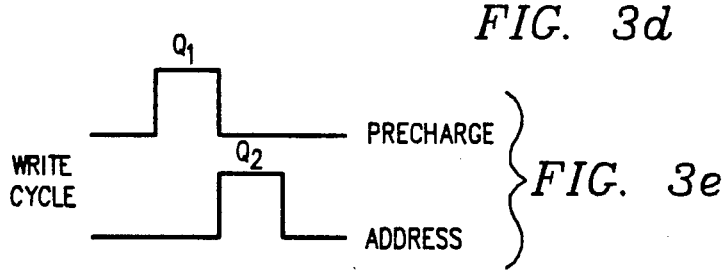

Illustrated in FIG. 3e is a write cycle of the DRAM array of the invention, wherein the precharge transistors 36 and 38 are driven during the Q1 phase for precharging the respective write bit line 14 and the read bit line 22 to the preselected voltages noted above. During the Q2 phase, address signals are decoded and applied to the appropriate row address write lines of the column to drive a selected write transistor into conduction. During the Q2 phase, the write column data line 68 is driven with a high logic level to thereby apply the column datum, via transistor 66, to the write bit line 14. Assuming the memory cell 10 has been addressed by the row address write line 18, the Q2 clock phase will cause the column datum to be applied via transistor 66 to the write bit line 14 and stored in the storage node 15 of capacitor 16. Once the signal on the row address write line 18 switches to a logic low, the write transistor 12 is cutoff, thereby preserving the charge on the node 15 of capacitor 16.

Figure 3F:
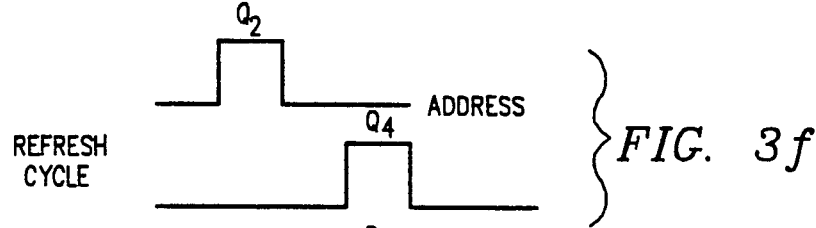

FIG. 3f illustrates a refresh cycle for refreshing the charge stored on the storage capacitors of the column cells. Refresh is accomplished during the Q2 and Q4 phases. Particularly, during clock phase Q2, the cell 10 to be refreshed is read, thereby driving the read transistor 20 into conduction and transferring the capacitor charge onto the read bit line 22. During the clock phase Q2, the input transistor 42 of the refresh circuit 40 is driven into conduction, whereupon the charge on the bit line 22 is input to the refresh sense amplifier 46. The refresh sense amplifier 46 senses the charge on the read bit line 22 and regenerates a datum signal depending upon whether the charge represents a "0" or "1" datum level. Accordingly, the refresh sense amplifier 46 functions to regenerate the charge stored on the capacitor 16 into a datum signal fully representative of the stored charge. During clock phase Q4, the output transistor 48 of the refresh circuit 40 is driven into conduction, thereby transferring the output of the refresh sense amplifier 46 onto the write bit line 14. Coincident therewith, the row address write line 18 of the refreshed cell 10 is driven into conduction, such that the write transistor 12 conducts and transfers the restored charge from the write bit line 14 back into the storage node 15 of capacitor 16. The cell is periodically refreshed in the noted manner so that valid data can be maintained over a long period of time. During each refresh cycle, one cell in each column of the array undergoes refreshing so that, for example in a memory array having 128 rows, the entire memory is completely refreshed in 128 refresh cycles. To be discussed in more detail below, there is provided a multiplexer for multiplexing program addresses and refresh addresses to the read address and write address lines of the memory array.

Figure 3G:
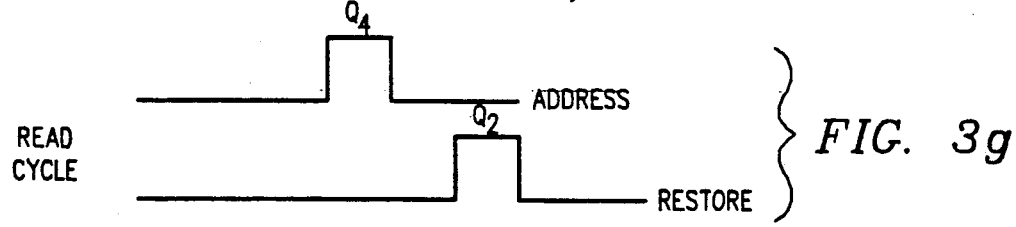

Shown next in FIG. 3g are the clock phases utilized in conducting a read operation of the DRAM memory of the invention. A read cycle of, for example cell 10, is initiated during a Q4 clock phase by driving the selected row address read line 24 with a logic high. As a consequence, the read transistor 20 is driven into conduction so that the charge stored on the capacitor 16 is transferred to the read bit line 22. During the Q4 phase, line 56 of the restore circuit 52 is also driven so that the input transistor 54 conducts. The charge then existing on the read bit line 22 is presented to the input of the read/restore sense amplifier 58. The read/restore sense amplifier 58 operates to translate the amount of charge into a datum high or low and outputs the same on the read column data line 60. The datum read out of the cell 10 is then available to external circuits to be driven as an output of the memory. As can be appreciated, the output of any selected column cell can be obtained in a single clock phase. However, due to the destructive nature of the read operation, the charge must be restored back into the storage capacitor 16 of the selected cell 10. The output of the read/restore sense amplifier 58 maintains the read column data line 60 precharged to the sensed logic level. On the occurrence of the Q2 clock phase, the output transistor 62 of the restore circuit 52 is driven into conduction and the previously precharged state of the write bit line 14 is changed accordingly. Simultaneously, the Q2 phase is operative to drive the write transistor 12 of the addressed cell 10 and connect the storage capacitor 16 to the write bit line 14. Hence, the charge output by the read/restore sense amplifier 58 is restored back into the storage capacitor 16 of the cell which was read.

With the foregoing memory array structure and timing, there exists a potential bus conflict during restore and write operations. This can occur particularly if a cell undergoes a read and write operation in adjacent machine cycles. In such an event, a conflict can exist between the restore portion of the read cycle and a subsequent write cycle. The bus contention conflict exists with respect to the write bit line 14 which is utilized during phase Q2 of both the restore and write operations. In other words, during such a contention situation, transistor 66 couples column data onto the write bit line 14 during the write cycle, while at the same time restore output transistor 62 couples restore data onto the same write bit line 14. Such a contention can be resolved by preventing the completion of the restore cycle, using an inhibit transistor, such as identified by device 70. To prevent the completion of the restore cycle, transistor 70 is driven with a logic low level, thereby placing it into a state of nonconduction so that the restore circuit output transistor 62 is also prevented from conducting. Hence, new column data can be written into the selected cell 10, thereby avoiding the contention problem. The prevention of the restore of the noted cell is of inconsequential concern, as the old data stored therein is irrelevant since new data is written into the cell. As noted above, the inhibit transistor 70 is normally in the conducting state, except during that time, if any, when consecutive read and write operations of the same cell occur. While not shown, circuits may be devised by those skilled in the art to detect a sequential read and write of the same cell to thereby generate a restore inhibit signal applied to the inhibit transistor 70. Other schemes may also be employed to inhibit the restore cycle during memory cycles where the noted contention conflict exists.

Figure 3H:
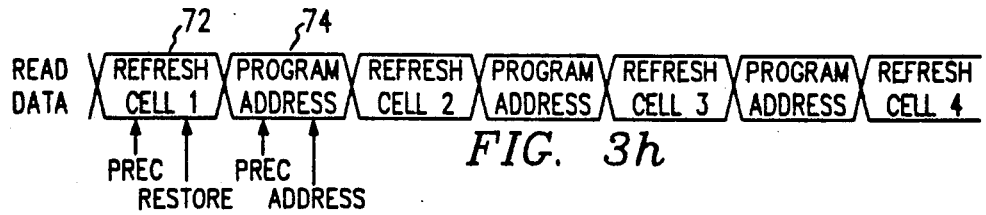

FIG. 3h shows electrical waveforms which are effective in accomplishing read operations of the memory array of the invention. Specifically shown are refresh cycles, such as 72, alternating with program address cycles, such as 74. Each refresh cycle includes a precharge phase and a refresh phase for refreshing a cell associated with each array column. Each program address cycle 74 includes a precharge phase followed by an address phase where the address is applied to the array column. In this manner the cells of each column can be read to either refresh the memory or to provide output data from the memory.

Figure 3I:
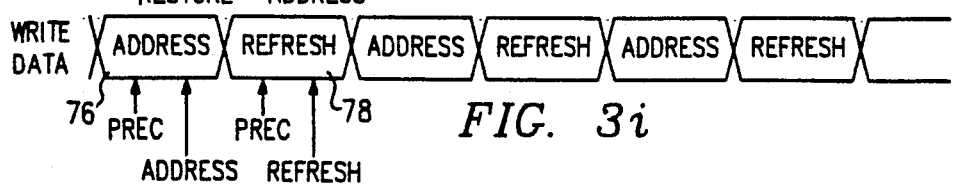

FIG. 3i depicts electrical waveforms which are effective in accomplishing write operations of the memory array of the invention. The write data cycle includes address cycles, such as 76, alternating between refresh cycles, such as 78. Each address cycle 76 comprises a precharge phase and an address phase, while each refresh cycle 78 includes precharge phase followed by a refresh phase. The noted write data timing is effective to enable write operations of the memory array to provide new input data thereto.

Figure 4:
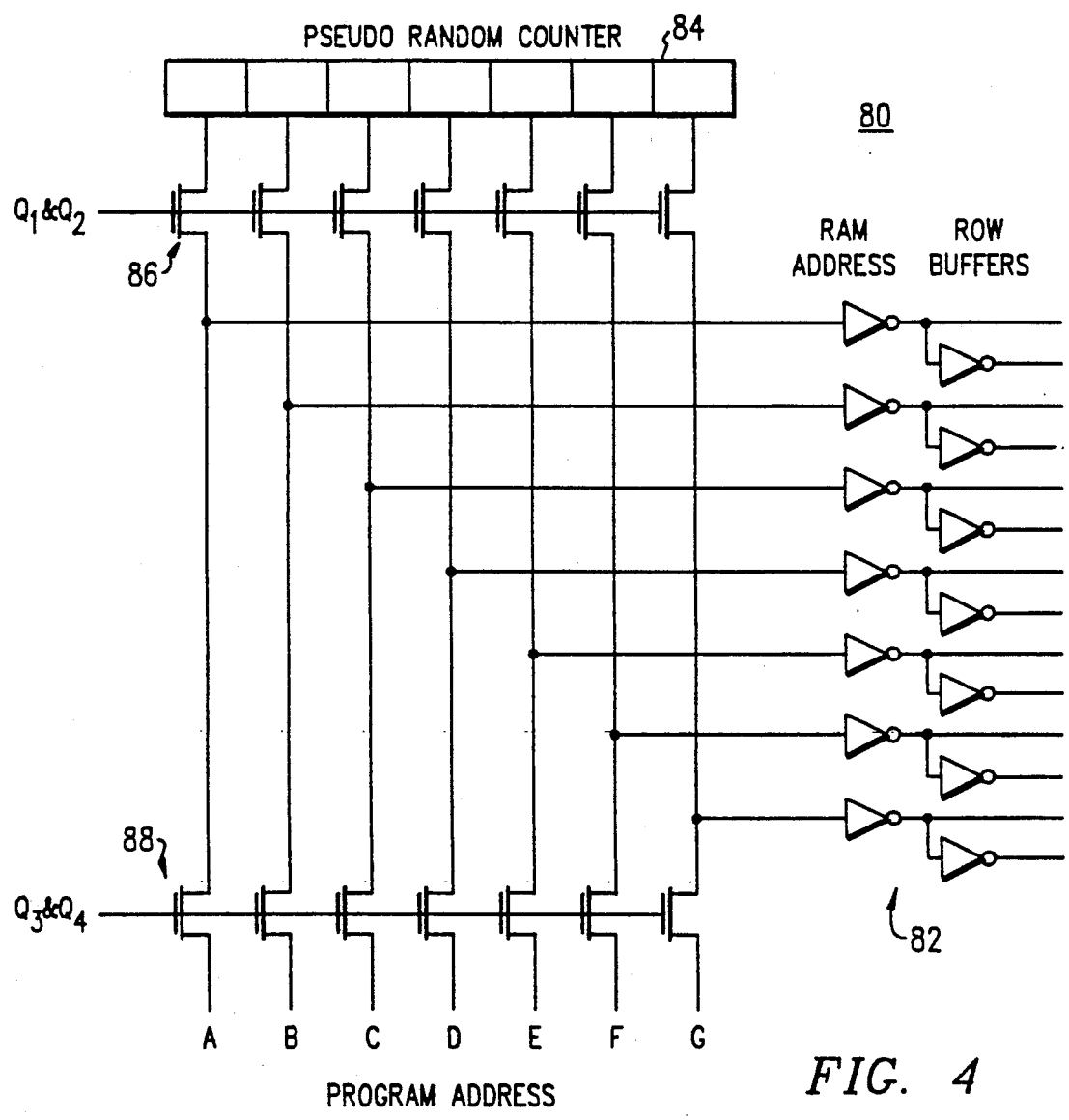
FIG. 4 is an electrical schematic diagram of an address multiplexer for use with the memory array of the invention.

Turning now to FIG. 4, there is shown a schematic illustration of a circuit 80 for multiplexing program addresses and refresh addresses for use by the DRAM device array of the invention. The addresses generated by the multiplexer 80 are coupled through a number of row address buffers 82 to the row address read and write lines of the memory array. The multiplexer 80 includes a psuedo random counter 84 for generating a unique state corresponding to each row of the memory array. The psuedo random counter 84 is constructed to cycle through all combinations of the noted states during a certain period of time to assure that all rows of the memory array are refreshed within a specified cyclic period of time. In the alternative, the counter 84 can be constructed as a binary counter for sequentially generating all of the refresh addresses. In the preferred form of the invention, the pseudo random counter 84 includes a number of stages adequate to uniquely address the total number of rows in the array. Connected to the output of each counter stage is a transistor, such as 86, gated by the Q1 and Q2 clock phases. As noted above, such phases correspond to the refresh time periods of the memory. The output of each such transistor 86 is coupled respectively to the input of a corresponding row address buffer 82.

The program addresses which are applied externally to the memory of the invention are coupled thereto by way of the multiplexer inputs A-G. Such inputs are, in turn, connected to respective transistors 88 which are clocked by phases Q3 and Q4. As noted above, such phases correspond to the program addressing of the memory array. The output of the transistors 88 are also connected to the respective inputs of the row address buffers 82. Hence, during clock phases Q1 and Q2, refresh addresses are supplied to the memory array, while during clock phases Q3 and Q4 program addresses are supplied to the memory array.

Data appearing on the read bit lines 22 of FIG. 2 during Q2 will be coupled to the refresh sense amplifier 46, sensed by such amplifier and transferred to the write bit line 14 during the phase Q4. The write address line 18 for the cell 10 being refreshed occurs at phase Q4, and can be implemented simply by delaying the read address of the same cell by two clock phases. Data on the read bit line 22 occurring at clock phase Q4, as a result of a program address, will be coupled to the read/restore sense amplifier 58, and sensed by such amplifier. The sensed data is then transferred to the write bit line 14 at clock phase Q2 and thus made available for restore purposes. The write addresses are generated by delaying the read addresses by two clock cycles, regardless of whether the addresses are generated externally by a program, or from the refresh address counter 84.

In FIG. 5, a substrate of semiconductor material scribed and broken into a chip 90 carries a random access memory (RAM) device 92, a read only memory (ROM) device 94 and a microprocessor 96 that together effect a microcomputer.

While the foregoing is described in connection with the use of NMOS precharge and discharge logic, it should be noted that the memory architecture can be implemented utilizing CMOS circuits with different clocking schemes. Disclosed is a versatile array for a dynamic random access memory device which may be highly beneficial in a variety of applications. A technical advantage of the invention is that the two-transistor cell itself is of symmetrical two-port architecture, wherein either read or write address and data operations can be reversed. Another technical advantage of the invention is that simultaneous read and write operations can occur with respect to different cells of the array, thereby improving the performance of the memory. Yet another technical advantage of the invention is that, when utilized as on-chip memory with microcomputers, a static-type of operation can be realized. To that end, the refresh operation of the memory of the invention implements the dual-port features thereof for refresh purposes, thereby relieving the programmer of the memory refresh responsibilities. Indeed, refresh operations of a cell in an array column can be undertaken while in the same machine cycle other cells in the column can be read or written.

While the preferred embodiment of the invention has been disclosed with reference to a specific DRAM memory array, and support circuits, it is to understood that many changes in detail may be made as a matter of engineering choices without departing from the spirit and scope of the invention, as defined by the appended claims.

What is claimed is:

1. An arrangement for a random access memory device, said arrangement comprising:
    A. a storage capacitor connected between a storage node and a reference voltage, said capacitor being capable of storing one datum level at a time on said storage node;
    B. first and second bit lines capable of carrying data levels;
    C. a first field effect transistor having a source and a drain connected between said first bit line and said storage node and a second field effect transistor having a source and a drain connected between said second bit line and said storage node, said first and second transistors having respective gates and being capable of electrically conducting data levels between said storage node and said first and second bit lines; and
    D. first and second row lines connected to respective ones of said gates of said first and second transistors, said row lines carrying respective row line signals that respectively activate said first and second transistors electrically to connect said first and second bit lines to said storage node.

2. The arrangement of claim 1 in which one of said first and second transistors is a write transistor and the other is a read transistor.

3. The arrangement of claim 2 in which said write transistor acts only to write data levels to said storage node from said respective bit line and said read transistor acts only to read data levels from said storage node to said respective bit line.

4. The arrangement of claim 3 in which said first transistor is a write transistor, said first bit line is a write bit line and said first row line is a write row line, and said second transistor is a read transistor, said second bit line is a read bit line and said second row line is a read row line.

5. The arrangement of claim 1 including plural groups of storage capacitors and first and second transistors connected to said first and second bit lines with each group connected to different first and second row lines to form a column of a memory array.

6. The arrangement of claim 1 in which said first bit line and first row line form a first port and said second bit line and second row line form a second port.

7. The arrangement of claim 1 in which said first bit line, first transistor and first row line form a circuit symmetrical with said second bit line, second transistor and second row line for reading and writing a datum from and to said storage node.

8. A column of random access memory devices said column comprising:
    A. first and second bit lines capable of carrying data levels along said column;
    B. plural memory cells arranged in series along said column, each cell including a storage capacitor connected between a storage node and a reference voltage to store one datum level on said storage node at a time, a first field effect transistor connected between said first bit line and said storage node, and a second field effect transistor connected between said second bit line and said storage node, said first and second transistors being capable of conducting data levels between said first and second bit lines and said storage node;
    C. a refresh circuit connected to said first and second bit lines and containing circuit elements capable of refreshing a datum level in a cell; and
    D. a read and restore circuit connected to said first and second bit lines and containing circuit elements capable of reading a datum level from a certain cell to form a datum signal on a datum line and restoring said read datum level back in said certain cell.

9. The column of claim 8 in which one of said first and second transistors is a wire transistor and the other is a read transistor.

10. The column of claim 9 in which said write transistor acts only to write data levels to said storage node from said respective bit line and said read transistor acts only to read data levels from said storage node to said respective bit line.

11. The column of claim 9 in which said first transistor is a write transistor, said first bit line is a write bit line and said first row line is a write row line, and said second transistor is a read transistor, said second bit line is a read bit line and said second row line is a read row line.

12. The column of claim 8 in which said memory device operates in a cycle including four clock phases carried on respective first, second, third and fourth phase lines, said column includes a charge setting circuit connected to said first and second bit lines and selected phase lines to set desired voltages on said bit lines at said selected clock phases, and said refresh circuit and said read and restore circuit connect to selected phase leads respectively to refresh said data levels and read and restore said data levels at selected clock phases.

13. The column of claim 12 in which said charge setting circuit connects to said first and third phase lines and said refresh and said read and restore circuits connect to said second and fourth phase lines.

14. The column of claim 12 in which said charge setting circuit sets one of said first and second bit lines at about a certain voltage and sets the other bit line at about half of said certain voltage.

15. The column of claim 12 including a different first row line connected to a gate of each first transistor of each cell and a different second row line connected to a gate of each second transistor of each cell, row signals on said first row lines occurring independently of row signals on said second row lines so that a datum level in one cell can be transferred between said first bit line and one storage node independently of a datum level in another cell being transferred between said second bit line and another storage node.

16. The column of claim 15 in which said first transistor, first bit line and first row line perform a write operation to said one storage node and said second transistor, second bit line and second row line perform a read operation from said another storage node.

17. The column of claim 15 in which said datum level in one cell can be transferred between said first bit line and said one storage node at the same time as said datum level in another cell is transferred between said second bit line and said another storage node.

18. An address circuit for addressing the column of claim 8 including a counter circuit producing counter row signals on row lines connected to different ones of said first and second transistors, said counter row signals occurring in conjunction with operation of said refresh circuit to refresh data levels in said cells within a certain period.

19. The address circuit of claim 18 in which said counter circuit includes a pseudo random counter producing counter row signals for all of said row lines.

20. The address circuit of claim 19 in which said memory device produces address row signals in response to address signals applied to said device and including a multiplexer circuit connecting one of said counter rows and said address rows to said row lines at one time.

21. The address circuit of claim 20 in which said memory device operates in a cycle including four clock phases carried on respective first, second, third and fourth phase lines, said multiplexer circuit includes counter gates connected to said first and second phase lines to connect said counter row signals to said row lines during said first and second phases, and said multiplexer circuit includes address gates connected to said third and fourth phase lines to connect said address row signals to said row lines during said third and fourth phases.

22. The column of claim 8 in which said read and restore circuit includes a sense amplifier having an input and an output, an input field effect transistor connecting the datum level on one bit line to said sense amplifier input and an output field effect transistor connecting the amplified datum level from said sense amplifier output to the other bit line, said datum line connecting to said sense amplifier output.

23. The column of claim 22 including a restore inhibit circuit connected to said read and restore circuit to inhibit restore operations of said read and restore circuit in response to receipt of an inhibit signal or an inhibit line.

24. The column of claim 23 in which said restore inhibit circuit connects to said output transistor to prevent connection of said amplified datum level to said other bit line.

25. The column of claim 24 in which said memory device operates in a cycle including four clock phases carried on respective first, second, third and fourth phase lines, said inhibit circuit includes an inhibit field effect transistor connecting said second phase line to said output transistor and disconnecting said second phase line from said output transistor in response to said inhibit signal.

26. The column of claim 8 in which said refresh circuit includes a sense amplifier having an input and an output, an input field effect transistor connecting a datum level on one bit line to said sense amplifier input and an output field effect transistor connecting the amplifier datum level from said sense amplifier output to the other bit line.

27. The column of claim 26 in which said memory device operates in a cycle including four clock phases carried on respective first, second, third and fourth phase lines, a gate of said input transistor connects to said second phase line and a gate of said output transistor connects to said fourth phase line.

28. An arrangement for a random access memory device, said arrangement comprising:
   A. a first and second transistors capable of independently conducting data levels; and
   B. one memory cell connected between said first and second transistors, said memory cell including one storage node capable of storing electrical charge representing a datum level and first and second conductors respectively connected between said first and second transistors and said one storage node and capable of conducting data levels between said transistors and said one storage node.

29. The arrangement of claim 29 including plural memory cells each including one storage node connected between said first and second ports by respective first and second transistors and conductors.

30. The arrangement of claim 28 including a refresh circuit coupled to said first and second transistors and including circuit elements for automatically refreshing a datum level stored on said storage node within a certain period.

31. The arrangement of claim 30 in which said refresh circuit elements include one sense amplifier having an input and an output, an input field effect transistor connecting a datum level on one of said first and second transistors to said sense amplifier input and an output field effect transistor connecting the amplified datum level from said sense amplifier output to the other of said first and second transistors.

32. The arrangement of claim 28 including a read-restore circuit connected between said first and second transistors and including circuit elements for reading a datum level at one of said first and second transistors and writing that datum level to the other of said first and second transistors so that a datum level read from said storage node to one of said first and second transistors becomes written back to that storage node through said other of said first and second transistors.

33. The arrangement of claim 32 in which said read-restore circuit elements include one sense amplifier having an input and an output, an input field effect transistor connecting the datum level on one of said first and second transistors to said sense amplifier input and an output field effect transistor connecting the amplified datum level from said sense amplifier output to the other of said first and second transistors.

34. The arrangement of claim 28 in which said memory device operates in a cycle including four clock phases carried on respective first, second, third and fourth phase lines, and said first and second transistors being connected to selected ones of said phase lines to provide independent access of said storage node through said access first and second transistors.

35. The arrangement of claim 28 including a substrate of semiconductor material carrying plural memory cells in a memory array, and carrying a microprocessor to form a microcomputer.

* * * * *